United States Patent [19]

Kinoshita

[11] Patent Number: 5,399,858
[45] Date of Patent: Mar. 21, 1995

[54] PHOTO-SEMICONDUCTOR MODULE HAVING THERMO-ELEMENT

[75] Inventor: Kitoshi Kinoshita, Kawasaki, Japan
[73] Assignee: Fujitsu Limited, Kawasaki
[21] Appl. No.: 3,806
[22] Filed: Jan. 13, 1993
[30] Foreign Application Priority Data
  Jan. 14, 1992 [JP] Japan .................................. 4-004679
[51] Int. Cl.⁶ .......................................... H01J 5/02
[52] U.S. Cl. ...................................... 250/239; 372/36
[58] Field of Search ............... 250/239, 238; 372/31, 372/34, 36

[56] References Cited

U.S. PATENT DOCUMENTS

| | | | |
|---|---|---|---|
| 4,768,070 | 8/1988 | Takizawa et al. | 372/31 |
| 4,802,178 | 1/1989 | Ury | 372/36 |
| 4,803,689 | 2/1989 | Shibanuma | 372/36 |
| 4,912,715 | 3/1990 | Aoki et al. | 372/36 |
| 4,955,029 | 9/1990 | Lecoy et al. | 372/31 |
| 5,005,178 | 4/1991 | Kluitmans et al. | 372/36 |
| 5,113,404 | 5/1992 | Gaebe et al. | 372/36 |
| 5,181,214 | 1/1993 | Berger et al. | 372/36 |
| 5,214,660 | 5/1993 | Masuko et al. | 372/36 |
| 5,227,646 | 7/1993 | Shigeno | 372/36 |

FOREIGN PATENT DOCUMENTS 0276892  12/1987  Japan ................................ 372/36

*Primary Examiner*—David C. Nelms
*Attorney, Agent, or Firm*—Staas & Halsey

[57] ABSTRACT

A photo-semiconductor module includes a laser diode for emitting a laser beam, a lens and a photo-detector arranged in a casing so as to be optically coupled to each other. The laser beam, emitted from the laser diode, travels through the lens and exits the casing, and the photo-detector detects at least a part of the laser beam and outputs a detection signal used for controlling the laser diode. The laser diode and the lens are mounted on a first structure and thermally coupled thereto and the first structure is mounted on and thermally coupled to a cooling-element, thereby to cool the laser diode by conducting heat coupled therefrom and through the first structure to the cooling element. The photo-detector is mounted on a second structure which is thermally isolated from the cooling-element.

7 Claims, 3 Drawing Sheets

PHOTO-SEMICONDUCTOR MODULE HAVING THERMO-ELEMENT

BACKGROUND OF THE INVENTION (1) Field of the Invention

The present invention generally relates to a photo-semiconductor module for emitting a light beam, and more particularly to a photo-semiconductor module in which a light source is cooled by a thermo-element so as to be maintained within a predetermined temperature range.

A photo-semiconductor module for emitting a light beam is used for optical communication. The photo-semiconductor module generally comprises a photo-semiconductor element such as a laser diode (hereinafter referred to as an LD element), an optical system, a photo detector such as a photo diode (hereinafter referred to as a PD element) and the like in a casing. A light beam emitted from the LD element travels through the optical system and goes out of (i.e., exits) the casing.

To drive the LD element in a stable state, the LD element must be maintained within a constant temperature range even if environmental conditions of the LD element are varied. Thus, a thermo-element is mounted in the casing of the photo-semiconductor module. The thermo-element cools the LD element so that the LD element, which is driven, is maintained within a predetermined temperature range.

(2) Description of the Related Art

A conventional photo-semiconductor module is shown in FIG.1. Referring to FIG. 1, an LD element 3 is fixed on a first holder 8a, a lens 4 is supported by a second holder 8b and a PD element 6 is fixed on a third holder 8c. The first, second and third holders 8a, 8b and 8c are mounted on a base plate 10 so that the first holder 8a is positioned between the second and third holders 8b and 8c. The base plate 10 is mounted on a thermo-element 7 fixed on a bottom plate of the casing 2. The LD element 3 a emits laser beam from the front and from the rear surfaces thereof. The laser beam emitted from the rear surface of the LD element 3 is detected by the PD element 6. The LD element 3 is controlled, based on a detecting signal from the PD element 6, so that the output power of the LD element 3 is within a predetermined range. The laser beam emitted from the front surface of the LD element 3 travels through the lens 4 and a window 5, provided on a wall of the casing 2, and goes out of i.e., exits the casing 2.

The LD element 3, the lens 4 and the PD element 6 are respectively thermally coupled to the thermo-element 7 via the base plate 10 and the first, second and third holders 8a, 8b and 8c. The thermo-element 7 is supplied with an electric current and cools the LD element 3, the lens 4 and the PD element 6, based on a Peltier effect. That is, the thermo-element 7 operates as a cooling-element for the LD element 3. A thermo-detector 9 for detecting the temperature of the first holder 8a is fixed on the first holder 8a. The amount of electric current to be supplied to the thermo-element 7 is controlled, based on a detecting signal from the thermo-detector 9, so that the LD element 3 is maintained within a predetermined temperature range.

To emit a narrow laser beam, optical axes of the LD element 3 and the lens 4 must be precisely aligned with each other. In the above conventional photo-semiconductor module, the LD element 3 and the lens 4 are respectively mounted on the single base plate 10 via the holders 8a, 8b. Thus, it is not difficult to precisely align the respective optical axes of the LD element 3 and the lens 4 with each other. On the other hand, as only a part of the laser beam from the LD element 3 may be input to the PD element 6, it is unnecessary to precisely align the respective optical axes of the LD element 3 and the PD element 6 with each other. However, in the above conventional photo-semiconductor module, although the PD element 6 and the LD element 3 need not precisely face each other, the PD element 6 is also mounted on the same base plate 10 as the LD element 3 and the lens 4. As a result, a large number of components (i.e., the LD element 3, the lens 4, the PD element 6, the holders 8a, 8b and 8c and the base plate 10) are thermally coupled to the thermo-element 7. Thus, to cool the large number of components so that the temperature thereof is controlled within a predetermined range, a large amount of electrical current must be supplied to the thermo-element 7. That is, the power dissipation of the thermo-element 7 becomes large.

SUMMARY OF THE INVENTION

Accordingly, a general object of the present invention is to provide a photo-semiconductor module in which the disadvantages of the aforementioned prior art are eliminated.

A more specific object of the present invention is to provide a semiconductor module, having a thermo-element, in which module the power dissipation of the thermo-element can be decreased.

The above objects of the present invention are achieved by a photo-semiconductor module in which a photo-semiconductor element for emitting a light beam, an optical system and a photo-detector are arranged in a casing so as to be optically coupled to each other, the light beam emitted from the photo-semiconductor element (i.e., exiting) traveling through the optical system and going out of the casing, and the photo-detector detecting a part of the light beam emitted from the photo-semiconductor element and outputting a detecting signal used for controlling the photo-semiconductor element, the photo-semiconductor module comprising: a first structure on which the semiconductor element and the optical system are mounted; a second structure on which the photo-detector is mounted; and a thermo-element, coupled to the first structure, for cooling the photo-semiconductor element via the first structure, wherein the second structure is thermally isolated from the thermo-element.

According to the present invention, the second structure on which the photo-detector is mounted is thermally isolated from the thermo-element so that the second structure is not cooled by the thermo-element. Thus, the amount of current to be supplied to the thermo-element can be decreased. That is, the power dissipation of the thermo-element can be decreased.

Additional objects, features and advantages of the present invention will become apparent from the following detailed description when read in conjunction with the accompanying drawings.

DESCRIPTION OF THE PREFERRED EMBODIMENTS

Figure 1:
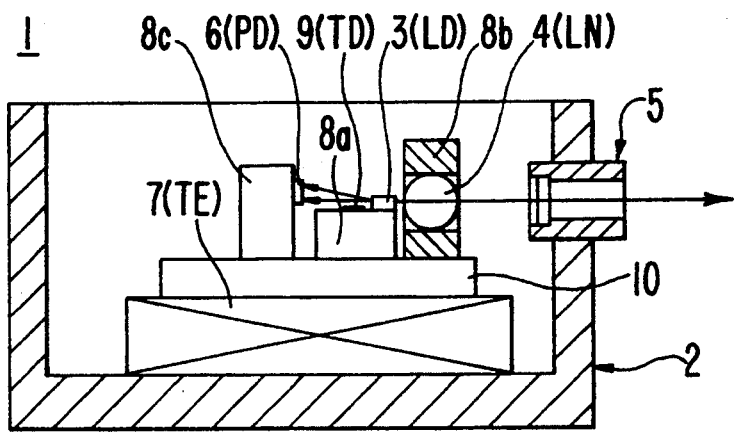
FIG. 1 is a cross sectional view showing a conventional photo-semiconductor module.
Figure 2:
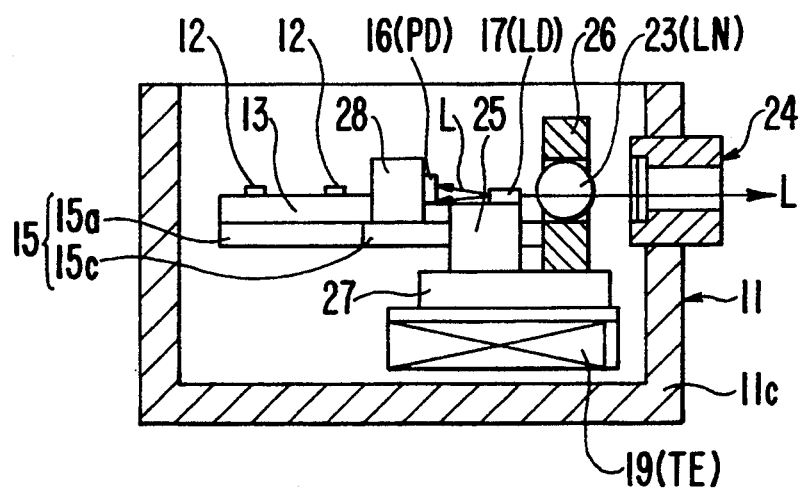
FIGS. 2 and 3 are respectively a cross sectional view and a plan view showing a photo-semiconductor module according to an embodiment of the present invention.
Figure 3:
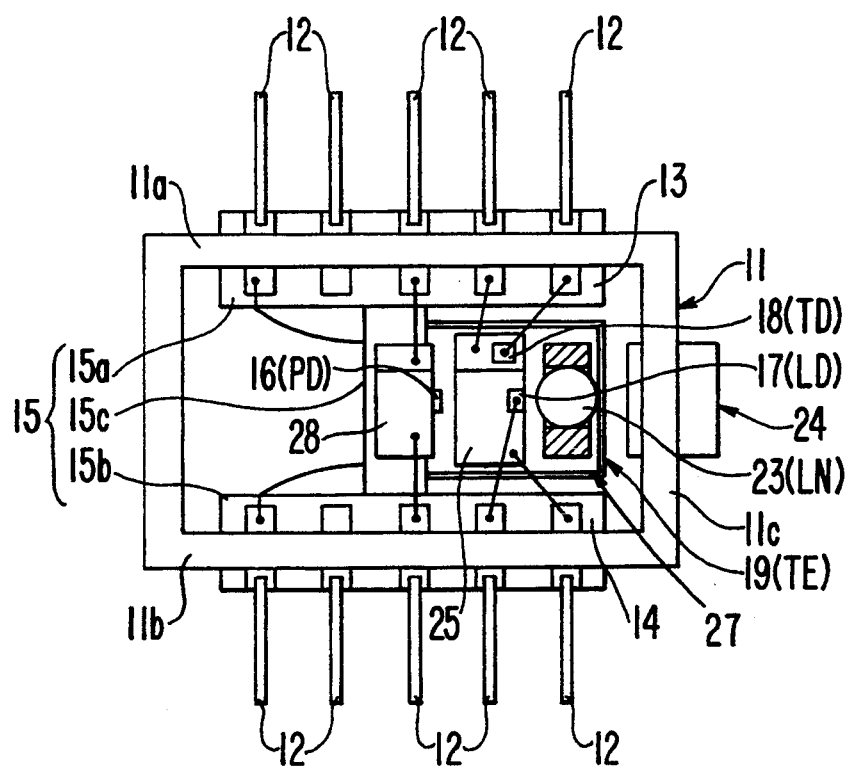
Figure 4:
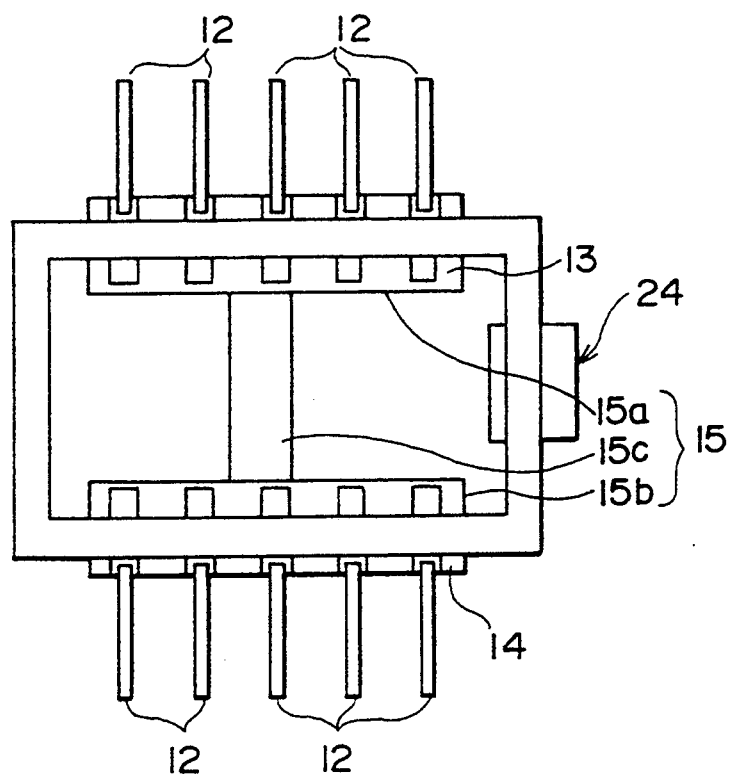
FIG. 4 is a plan view showing a structure by which leads are supported.

A description will now be given, with reference to FIGS. 2 through 5, of an embodiment of the present invention. In FIGS. 2, 3 and 4, a lid covering the casing 11 of a photo-semiconductor module is omitted.

Referring to FIGS. 2 and 3, a casing 11 of a photo-semiconductor module 10 houses a laser diode (an LD element) 17, a photo-diode (a PD element) 16 and a lens 23. The casing 11 is made of a material such as 42-alloy, kovar (alloy of Fe, Ni and Co) or the like. Brackets 15a and 15b project respective from side walls 11a and 11b of the casing 11 toward the inside of the casing 11. Lead bases 13 and 14 for supporting a plurality of leads 12 are respectively fixed on the side walls 11a and 11b so as toward project from the side walls 11a and 11b to both the inside and the outside of the casing 11. The lead bases 13 and 14 are made of ceramic. In the inside of the casing 11, the lead bases 13 and 14 are respectively supported by the side walls 11a and 11b of the casing 11. The leads 12 are electrically isolated from each other by the lead bases 13 and 14 made of ceramic. Thus, external noises are prevented from entering into an electric circuit in the casing 11 via the leads 12. A supporting plate 15c is provided between the brackets 15a and 15b so that opposite ends of the supporting plate 15c are respectively connected to the brackets 15a and 15b, as shown in FIG. 4. The supporting plate 15c is used for supporting the PD element 16 as will be described later.

When drive power is supplied to the LD element 17 via predetermined leads 12, the LD element 17 emits laser beams from the both front and rear surface thereof, as indicated by arrows L in FIG.2. When emitting the laser beams, the LD element 17 generates heat. Beam emission characteristics of the LD element 17 change in accordance with environmental conditions (the temperature and other conditions of the environment) of the LD element 17. To obtain a stable emission condition of the LD element 17, the LD element 17 must be cooled so as to be maintained within a predetermined temperature range.

The LD element 17 is mounted on a block 25. A lens 23 is supported by a holder 26. Both the block 25 and the holder 26 are fixed on a mounting base 27 by, for example, a brazing process so that the lens 23 is positioned in front of the LD element 17. The mounting base 27 is fixed on a thermo-element 19 mounted on a bottom plate, or walls, of the casing 11. When a current is supplied to the thermo-element 19, the thermo-element 19 absorbs the heat generated by the LD element 17 and conducted thereto via the block 25 and the mounting base 27. A window assembly 24 is mounted on a front wall 11c of the casing 11 under a condition in which the airtightness of the casing 11 is maintained. The laser beam emitted from the front surface of the LD element 17 travels through the lens 23 and the window assembly 24 and goes out of the casing 11. A thermo-detector 18 is mounted on the block 25 supporting the LD element 17. A detecting signal, output from the thermo-detector 18, is supplied to an external thermo-controller (not shown) via predetermined leads 12. The external thermo-controller controls the amount of current to be supplied to the thermo-element 19 based on the detecting signal from the thermo-detector 18 so that the LD element 17 is maintained within a predetermined temperature range.

The PD element 16 is mounted on a block 28. The block 28 is fixed on the supporting plate 15c so that the PD element 16 faces the LD element 17. The supporting plate 15c is separated (i.e., spaced) from the thermo-element 19, so that the PD element 16 is thermally isolated from the thermo-element 19. The PD element 16 outputs a detecting signal having a level corresponding to the amount of light projecting thereon. The detecting signal output from the PD element 16 is supplied to an external drive controller via leads 12. The external drive controller controls the LD element 17, based on the detecting signal supplied from the PD element 16, so that the amount of light projecting onto the PD element 16 becomes a constant value. That is, the intensity of the laser beam emitted from the LD element 17 becomes constant.

Figure 5:
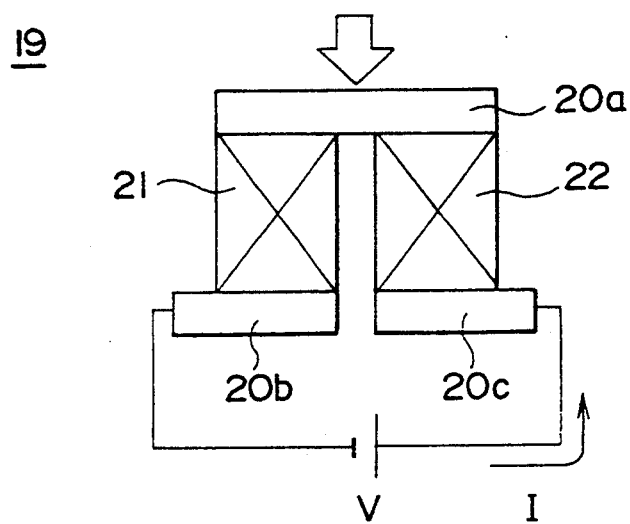
FIG. 5 is a diagram illustrating a thermo-element provided in the photo-semiconductor module shown in FIGS. 2 and 3.

The thermo-element (TE) 19 is formed as shown in FIG. 5. The thermo-element 19 is a type of heat pump using an electrothermic semiconductor. Referring to FIG. 5, a first end of a P-type electrothermic semiconductor element 21 and a first end of an N-type electrothermic semiconductor element 22 are connected by a common electrode 20a. Electrodes 20b and 20c are respectively formed on second ends of the P-type and N-type electrothermic semiconductor elements 21 and 22. When a current flows from the electrode 20b to the electrode 20c as shown by the arrow, the common electrode 20a absorbs heat and the electrodes 20b and 20c radiate heat, based on the Peltier effect. The amount of heat absorbed by the common electrode depends on the amount of current flowing between the electrodes 20b and 20c. Thus, the external thermo-controller controls the amount of current flowing between the electrodes 20b and 20c, based on the detecting signal from the thermo-detector 18, so that the LD element 17 is maintained within a predetermined temperature range. The heat radiated from the electrodes 20b and 20c of the thermo-element 19 is further radiated to the air outside the casing 11.

In the above embodiment, the LD element 17 and the lens 23 are respectively mounted on the block 25 and the holder 26 which are fixed on the single mounting base 27. Thus, optical axes of the LD element 17 and the lens 23 can be precisely aligned with each other easily. On the other hand, the PD element 16 is mounted on the block 28 fixed on the supporting plate 15c, the latter being separated (i.e., spaced) from the mounting base 27. Thus, it is hard to precisely align optical axes of the PD element 16 and the LD element 17 with each other. However, as the PD element 16 may detect only a part of the laser beam slightly radially emitted from the LD element 17, it is unnecessary to precisely align the optical axes of the PD element 16 and the LD element 17. Thus, there is no problem in that the PD element 16 is mounted on the 1 block 28 separated from the mounting base 27 on which the block 25 supporting the LD element 17 is fixed.

According to the above embodiment, the PD element 16 is mounted on the block 28 which is fixed on the supporting plate 15c and the latter is separated, or spaced, from the mounting base 27 so that the PD element 16 is thermally isolated from the thermo-element 19. That is, the number of components to be cooled by the thermo-element 19 decreases. Thus, the amount of current to be supplied to the thermo-element 19 can be decreased.

In addition, as the block 28 supporting the PD element 16 is separated (i.e., spaced) from the mounting base 27 mounted on the thermo-element 19, the thermo-element 19 can be miniaturized. Thus, a space in the casing 11 can be effectively used for other elements and the production costs of the photo-semiconductor module can be decreased.

The present invention is not limited to the aforementioned embodiment, and variations and modifications may be made without departing from the scope of the claimed invention.

What is claimed is:

1. A photo-semiconductor module having a casing and a photo-semiconductor element for emitting a light beam, an optical system and a photo-detector arranged in the casing so as to be optically coupled to each other, the light beam emitted from said photo-semiconductor element traveling through said optical system along a common optical axis and exiting said casing and said photo-detector detecting at least a part of the light beam emitted from said photo-semiconductor element and outputting a detecting signal used to control said photo-semiconductor element, said photo-semiconductor module comprising:
    a first structure on which said photo-semiconductor element and said optical system are mounted, said photo-semiconductor element being thermally coupled to said first structure such that heat, generated in said photo-semiconductor element by operation thereof, is thermally coupled therefrom to, and conducted through said first structure;
    a cooling-element, said first structure being thermally coupled to said cooling element and said cooling element thereby receiving the heat, thermally coupled from said semiconductor element to and conducted through said first structure, and thereby cooling said photo-semiconductor element; and
    a second structure, spaced from said first structure and said cooling element, comprising a first supporting member which supports said photo-detector and a second supporting member which supports said first supporting member so that said first supporting member is positioned above and displaced from, and thereby thermally isolated from, said cooling element within said casing.

2. The photo-semiconductor module as claimed in claim 1, wherein said first supporting member further comprises:
    a block on which said photo-detector is mounted; and
    a supporting plate having a surface parallel to the common optical axis of said photo-semiconductor element, said block being mounted on the surface of said supporting plate.

3. The photo-semiconductor module as claimed in claim 2, wherein:
    the casing comprises a pair of spaced side walls forming a part of the second supporting member; and
    said supporting plate has a pair of opposite ends and extends between and is connected at the pair of opposite ends thereof respectively to said pair of spaced side walls of said casing.

4. The photo-semiconductor module as claimed in claim 1, further comprising:
    a thermo-detector, mounted on said first structure, which detects the temperature of said first structure and produces a corresponding temperature detection output; and
    said cooling-element being controlled in accordance with the temperature detection output of said thermo-detector thereby to maintain the temperature of said first structure, and correspondingly of said photo-semiconductor element, within a temperature range.

5. The photo-semiconductor module as claimed in claim 1 wherein said cooling element comprises a thermo-element selectively operable for absorbing and radiating heat in accordance with a Peltier effect.

6. The photo-semiconductor module as claimed in claim 1, wherein said first structure further comprises:
    a first block on which said photo-semiconductor element is mounted;
    a holder on which said optical system is mounted and supported; and
    a common base on which said first block and said holder are fixedly mounted.

7. The photo-semiconductor module as claimed in claim 1 wherein said first structure is mounted on said cooling-element.

* * * * *

UNITED STATES PATENT AND TRADEMARK OFFICE
CERTIFICATE OF CORRECTION

PATENT NO. : 5,399,858
DATED : March 21, 1995
INVENTOR(S) : KINOSHITA

It is certified that error appears in the above-indentified patent and that said Letters Patent is hereby corrected as shown below:

TITLE PAGE: [73] Assignee, after "Kawasaki" insert --, Japan--.

Col. 1, line 41, change "a emits" to --emits a--;
line 50, change "i.e., emits" to --(i.e., exits)--

Col. 2, line 39, delete "(i.e., exiting)";
line 40, after "out of" insert --(i.e., exiting)--.

Col. 3, line 20, change "respective from" to --from respective--;
line 24, change "toward" to --to--; and change "to" to --toward--;
line 40, change "the both" to --both the--; and change "rear surface" to --the rear surfaces--.

Col. 4, line 61, delete "1".

Signed and Sealed this

Twenty-eighth Day of November 1995

Attest:

BRUCE LEHMAN

Attesting Officer    Commissioner of Patents and Trademarks